(12) United States Patent
Wagatsuma et al.

(10) Patent No.: US 11,664,266 B2
(45) Date of Patent: May 30, 2023

(54) SUBSTRATE PROCESSING APPARATUS AND SUBSTRATE DELIVERY METHOD

(71) Applicant: Tokyo Electron Limited, Tokyo (JP)

(72) Inventors: Yuichiro Wagatsuma, Yamanashi (JP); Kentaro Asakura, Yamanashi (JP); Tetsuya Saitou, Yamanashi (JP); Masahisa Watanabe, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 311 days.

(21) Appl. No.: 16/915,046

(22) Filed: Jun. 29, 2020

(65) Prior Publication Data
US 2021/0005505 A1 Jan. 7, 2021

(30) Foreign Application Priority Data
Jul. 5, 2019 (JP) .............................. JP2019-126198

(51) Int. Cl.
| | | |
|---|---|---|
| H01L 21/68 | (2006.01) | |
| H01L 21/687 | (2006.01) | |
| H01L 21/67 | (2006.01) | |
| H01L 21/677 | (2006.01) | |

(52) U.S. Cl.
CPC .. *H01L 21/68742* (2013.01); *H01L 21/67098* (2013.01); *H01L 21/67751* (2013.01)

(58) Field of Classification Search
CPC ....................... H01L 21/68742; H01L 21/6875
See application file for complete search history.

(56) References Cited

U.S. PATENT DOCUMENTS

| | | | | |
|---|---|---|---|---|
| 6,148,762 A * | 11/2000 | Fukuda | ............. | H01L 21/68742 414/935 |
| 6,435,798 B1* | 8/2002 | Satoh | ................ | H01L 21/68742 414/217 |
| 6,953,338 B2* | 10/2005 | Kreiser | ............. | H01L 21/68785 211/41.18 |
| 7,393,207 B2* | 7/2008 | Imai | .................. | H01L 21/67109 211/41.18 |

(Continued)

FOREIGN PATENT DOCUMENTS

| | | |
|---|---|---|
| JP | 11-111821 A | 4/1999 |
| KR | 1020060112210 A | 10/2006 |
| KR | 1020130095290 A | 8/2013 |

*Primary Examiner* — Gregory A Wilson
(74) *Attorney, Agent, or Firm* — Nath, Goldberg & Meyer; Jerald L. Meyer; Tanya E. Harkins

(57) ABSTRACT

A substrate processing apparatus includes: a stage for performing at least one of heating and cooling on a substrate placed thereon and having a through-hole vertically penetrating the stage; a substrate support pin having an insertion portion inserted into the through-hole and configured so that the insertion portion protrudes from an upper surface of the stage through the through-hole; and a pin support member for supporting the substrate support pin. The substrate support pin has a flange portion located below a lower surface of the stage. The support member supports the substrate support pin by engagement with the flange portion. The through-hole is smaller than the flange portion. The substrate support pin includes a first member including the flange portion and a second member having the insertion portion. The first member has a sliding surface which slidably supports the second member.

20 Claims, 9 Drawing Sheets

(56) References Cited

U.S. PATENT DOCUMENTS

| | | | | |
|---|---|---|---|---|
| 11,302,565 | B2* | 4/2022 | Moos | H01L 21/68792 |
| 2003/0178145 | A1* | 9/2003 | Anderson | H01L 21/68735 |
| | | | | 118/728 |
| 2004/0241992 | A1* | 12/2004 | Kono | H01L 21/6835 |
| | | | | 438/689 |
| 2006/0075972 | A1* | 4/2006 | Nakashima | H01L 21/68721 |
| | | | | 118/725 |
| 2008/0190367 | A1* | 8/2008 | Lee | H01L 21/68742 |
| | | | | 118/500 |
| 2010/0244350 | A1* | 9/2010 | Fujisato | H01L 21/68785 |
| | | | | 269/289 R |
| 2013/0025538 | A1* | 1/2013 | Collins | H01L 21/67115 |
| | | | | 118/712 |

* cited by examiner

SUBSTRATE PROCESSING APPARATUS AND SUBSTRATE DELIVERY METHOD

CROSS-REFERENCE TO RELATED APPLICATION

This application is based upon and claims the benefit of priority from Japanese Patent Application No. 2019-126198, filed on Jul. 5, 2019, the entire contents of which are incorporated herein by reference.

TECHNICAL FIELD

The present disclosure relates to a substrate processing apparatus and a substrate delivery method.

BACKGROUND

Patent Document 1 discloses a substrate processing apparatus that prevents substrate processing uniformity from being adversely affected by a backward flow of a processing gas when a substrate is processed at a high temperature. This substrate processing apparatus includes a susceptor, a lifting drive device, a plurality of substrate support pins, and a movement blocking member. The susceptor is arranged horizontally and is configured to support a substrate placed on the upper surface thereof. The lifting drive device raises and lowers the susceptor between a first position at which the substrate is supported and a second position which is lower than the first position and at which the susceptor waits for a substrate to be supported. The substrate support pins are supported so as to be movable in the vertical direction with respect to the susceptor and are configured to support the substrate when the susceptor is positioned at the second position. The movement blocking member blocks downward movement of the substrate support pins when the susceptor is moved from the first position to the second position. The susceptor has pin insertion holes into which the substrate support pins are inserted. The diameter of the upper end portions of the substrate support pins is set to be larger than that of the pin insertion holes. Thus, the substrate support pins are supported so as to be movable in the vertical direction with respect to the susceptor. A recess for accommodating the large-diameter upper end portion of each of the substrate support pins is formed at the upper end portion of each of the pin insertion holes of the susceptor.

PRIOR ART DOCUMENT

Patent Document (Patent Document 1) Japanese laid-open publication No. H11-111821

SUMMARY

According to one embodiment of the present disclosure, there is provided a substrate processing apparatus for processing a substrate, which includes: a stage having a through-hole penetrating the stage in a vertical direction and configured to place the substrate on an upper surface thereof and perform at least one of a heating process and a cooling process on the placed substrate; a substrate support pin provided with an insertion portion inserted into the through-hole and configured so that the insertion portion protrudes from the upper surface of the stage through the through-hole; and a pin support member configured to support the substrate support pin, wherein the substrate support pin is provided with a flange portion located below a lower surface of the stage, the pin support member is configured to support the substrate support pin by engagement with the flange portion, the through-hole of the stage is smaller than the flange portion of the substrate support pin, the substrate support pin includes a first member including the flange portion and a second member separated from the first member and provided with the insertion portion, and wherein the first member has a sliding surface on which the second member is placed and which slidably supports the second member.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
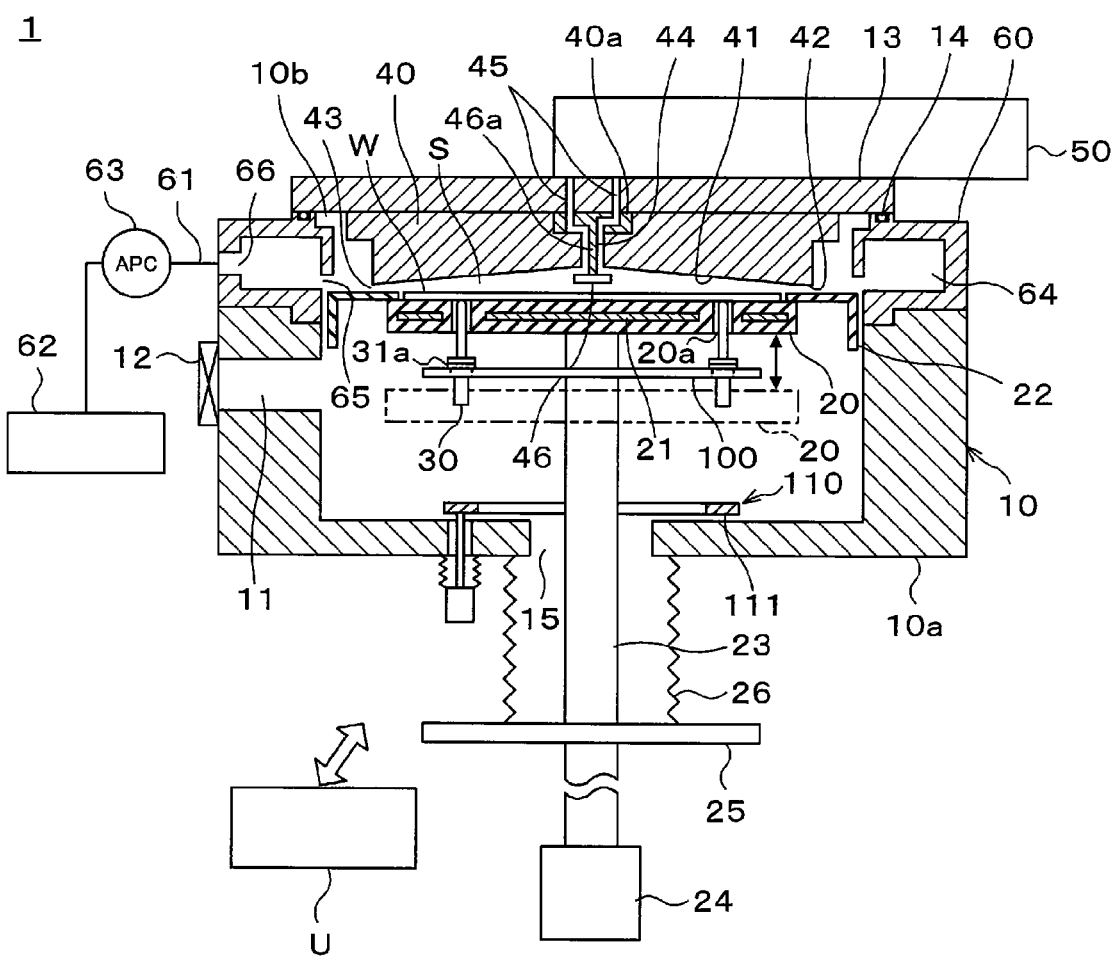
FIG. 1 is an explanatory view schematically showing an outline of a configuration of a film-forming apparatus as a substrate processing apparatus according to the present embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

For example, in a semiconductor device manufacturing process, a substrate process such as a film-forming process or the like is performed on a substrate such as a semiconductor wafer (hereinafter referred to as "wafer"). This substrate process is performed using a substrate processing apparatus. When the substrate processing apparatus is a single-wafer type substrate processing apparatus that processes substrates one by one, a stage having an upper surface on which a substrate is placed is provided inside the apparatus. Furthermore, the single-wafer type substrate processing apparatus is provided with substrate support pins to be inserted into holes formed in the stage in order to transfer the substrate between a substrate transfer device for transferring the substrate and the stage. The substrate support pins are fixed to, for example, a bottom wall of a processing container that accommodates the substrate.

By the way, during the substrate process, the substrate placed on the stage may be heated or cooled down through the stage. In this case, when the substrate support pins are fixed to the bottom wall of the processing container as described above, a positional deviation may occur between the holes of the stage and the substrate support pins due to the thermal expansion or shrinkage of the stage. Therefore, if the substrate support pins are fixed to the bottom wall of the processing container as described above, the substrate support pins may be damaged when the substrate support pins and the stage are relatively moved up and down to deliver the substrate. To address this, in Patent Document 1, the substrate support pins are not fixed to the bottom wall of the processing container, the diameter of an upper end portion of each substrate support pin is made larger than that of each pin insertion hole of a susceptor, and the substrate support pins are supported so as to be movable in the vertical direction with respect to the susceptor.

However, when the diameter of the upper end portion of each substrate support pin is made large, a recess having a diameter larger than the diameter of the upper end portion of each substrate support pin needs to be formed in the upper surface of the stage in order to accommodate the upper end portion of each substrate support pin. When such a recess is formed, the in-plane uniformity of the temperature of the substrate on the stage is impaired.

Furthermore, depending on the method of supporting the substrate support pins, the substrate support pins may be tilted as a result of the positional deviation between the holes of the stage and the substrate support pins caused by the thermal expansion or shrinkage of the stage. Thus, when the tilted substrate support pins and the stage are relatively moved up and down, the substrate support pins may be broken.

The technique according to the present disclosure improves the in-plane uniformity of the temperature of the substrate when heating or cooling the substrate placed on the stage having the through-holes through which the substrate support pins are inserted, and prevents breakage of the substrate support pins.

Hereinafter, a substrate processing apparatus and a substrate delivery method according to the present embodiment will be described with reference to the drawings. In the subject specification and the drawings, elements having substantially the same functional configuration will be designated by like reference numerals and duplicate descriptions thereof will be omitted.

FIG. 1 is an explanatory diagram schematically showing an outline of a configuration of a film-forming apparatus as a substrate processing apparatus according to the present embodiment, and shows a portion of the film-forming apparatus in cross section.

A film-forming apparatus 1 shown in FIG. 1 includes a processing container 10 which is capable of being depressurized and accommodates a wafer W as a substrate.

The processing container 10 includes a container body 10a having a cylindrical shape with a bottom. A loading/unloading port 11 through which the wafer W is transferred is formed in a side wall of the container body 10a. A gate valve 12 for opening/closing the loading/unloading port 11 is provided in the loading/unloading port 11. A below-described exhaust duct 60, which constitutes a portion of the side wall of the container body 10a, is provided above the loading/unloading port 11. An opening 10b is formed in an upper portion of the container body 10a, i.e., in the exhaust duct 60. A lid 13 is attached so as to close the opening 10b. An O-ring 14 for keeping the inside of the processing container 10 airtight is provided between the exhaust duct 60 and the lid 13.

A stage 20 having an upper surface on which the wafer W is horizontally placed is provided in the processing container 10. A heater 21 for heating the wafer W is provided inside the stage 20. When the wafer W needs to be cooled down, a cooling mechanism may be provided inside the stage 20. Both the heater 21 and the cooling mechanism may be provided inside the stage 20 so that both heating and cooling of the wafer W can be performed. The stage 20 is provided with a cover member 22 so as to cover a region on the outer peripheral side of the mounting region of the wafer W on the upper surface of the stage 20 and the lateral circumferential surface of the stage 20 in the circumferential direction.

An upper end of a support shaft member 23 as a stage support member extending in the vertical direction so as to penetrate through an opening 15 formed in the bottom wall of the processing container 10 is connected to the central portion of a lower surface of the stage 20. A lower end of the support shaft member 23 is connected to a drive mechanism 24 as a moving mechanism. The drive mechanism 24 generates a driving force for moving the support shaft member 23 up and down and rotating the support shaft member 23, and includes, for example, an air cylinder (not shown) or a motor (not shown). As the support shaft member 23 moves up and down with the driving of the drive mechanism 24, the stage 20 can move up and down between a transfer position indicated by a two-dot chain line and a processing position above the transfer position. The transfer position refers to a position where the stage 20 waits when the wafer W is delivered between a wafer transfer device M (see FIG. 5) as a substrate transfer device that enters the processing container 10 through the loading/unloading port 11 of the processing container 10 and lift pins 30 described later. Furthermore, the processing position refers to a position where a film-forming process is performed on the wafer W. As the support shaft member 23 is rotated about its axis line with the driving of the drive mechanism 24, the stage 20 rotates about the axis line.

A flange 25 is provided on the support shaft member 23 outside the processing container 10. A bellows 26 is provided between the flange 25 and a support shaft member penetration portion of the bottom wall of the processing container 10 so as to surround an outer peripheral portion of the support shaft member 23. Thus, the processing container 10 is kept airtight.

Furthermore, the stage 20 is formed with a plurality of through-holes 20a penetrating the stage 20 in the vertical direction. Moreover, the lift pins 30 as substrate support pins inserted into the above-described through-holes 20a from below are provided with respect to the stage 20. The lift pins 30 serve to deliver the wafer W between the wafer transfer device (not shown), which is inserted into the processing container 10 from the outside of the processing container 10, and the stage 20. The lift pins 30 are configured to be able to protrude from the upper surface of the stage 20 located at the above-described transfer position via the through-holes 20a. The lift pins 30 are provided for the respective through-holes 20a. A shape of the lift pins 30, a support structure of the lift pins 30, and a structure for raising and lowering the lift pins 30 will be described later.

Furthermore, a cap member 40 for forming a processing space S between the cap member 40 and the stage 20 is provided between the stage 20 and the lid 13 inside the processing container 10 so as to face the stage 20. The cap member 40 is fixed to the lid 13 by bolts (not shown).

A reversed bowl-shaped recess 41 is formed in a lower portion of the cap member 40. A flat rim 42 is formed on the outer side of the recess 41.

The processing space S is formed by the upper surface of the stage 20 located at the above-described processing position and the recess 41 of the cap member 40. The height of the stage 20 when the processing space S is formed is set so that a gap 43 is formed between a lower surface of the rim 42 of the cap member 40 and an upper surface of the cover member 22. For example, the recess 41 is formed so that the volume of the processing space S becomes as small as possible and the gas replacement property at the time of replacing a processing gas with a purge gas is good.

A gas introduction path 44 for introducing the processing gas or the purge gas into the processing space S is formed in the central portion of the cap member 40. The gas introduction path 44 penetrates through the central portion of the cap member 40. The gas introduction path 44 is provided so that the lower end thereof faces the central portion of the wafer W placed on the stage 20. A flow path forming member 40a is fitted into the central portion of the cap member 40. An upper side of the gas introduction path 44 is branched by the flow path forming member 40a. The branches communicate with respective gas introduction paths 45 that penetrate through the lid 13.

Below the lower end of the gas introduction path 44 of the cap member 40, there is provided a dispersion plate 46 for dispersing the gas discharged from the gas introduction path 44 into the processing space S. The dispersion plate 46 is fixed to the cap member 40 via a support rod 46a.

In the gas introduction path 45, there is provided a gas introduction mechanism 50 that introduces a $TiCl_4$ gas or an $NH_3$ gas used as the processing gas, and an $N_2$ gas used as the purge gas g, and the like into the processing container 10 from gas supply sources (not shown). An O-ring (not shown) for keeping the inside of the processing container 10 airtight is provided between the gas introduction mechanism 50 and the processing container 10, specifically between the gas introduction mechanism 50 and the lid 13.

Furthermore, one end of an exhaust pipe 61 is connected to the exhaust duct 60 of the container body 10a. The other end of the exhaust pipe 61 is connected to an exhaust device 62 configured by, for example, a vacuum pump. Furthermore, an APC valve 63 for adjusting an internal pressure of the processing space S is provided at an upstream side of the exhaust device 62 in the exhaust pipe 61.

The exhaust duct 60 is configured to annularly form a gas passage 64 having a rectangular vertical cross section. A slit 65 is formed on an inner circumferential surface of the exhaust duct 60 over the entire circumference. An exhaust port 66 is provided on an outer wall of the exhaust duct 60, and the exhaust pipe 61 is connected to the exhaust port 66. The slit 65 is formed at a position corresponding to the aforementioned gap 43 formed when the stage 20 is raised to the aforementioned processing position. Therefore, by operating the exhaust device 62, the gas in the processing space S is moved to the gas passage 64 of the exhaust duct 60 through the gap 43 and the slit 65, and is exhausted through the exhaust pipe 61.

The film-forming apparatus 1 configured as described above is provided with a controller U. The controller U is composed of, for example, a computer including a CPU and a memory. The controller U includes a program storage part (not shown). The program storage part stores a program or the like for implementing a below-described wafer processing in the film-forming apparatus 1. The program may be recorded in a non-transitory computer-readable storage medium, and may be installed in the controller U from the storage medium. In addition, the program may be partly or entirely implemented by a dedicated hardware (circuit board).

Figure 2:
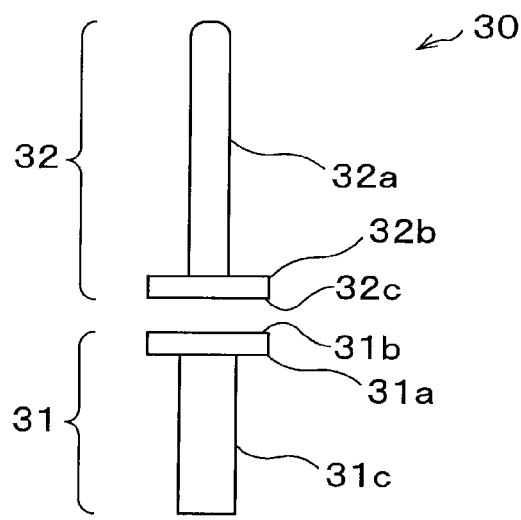
FIG. 2 is an explanatory view showing an outline of a configuration of lift pins.
Figure 3:
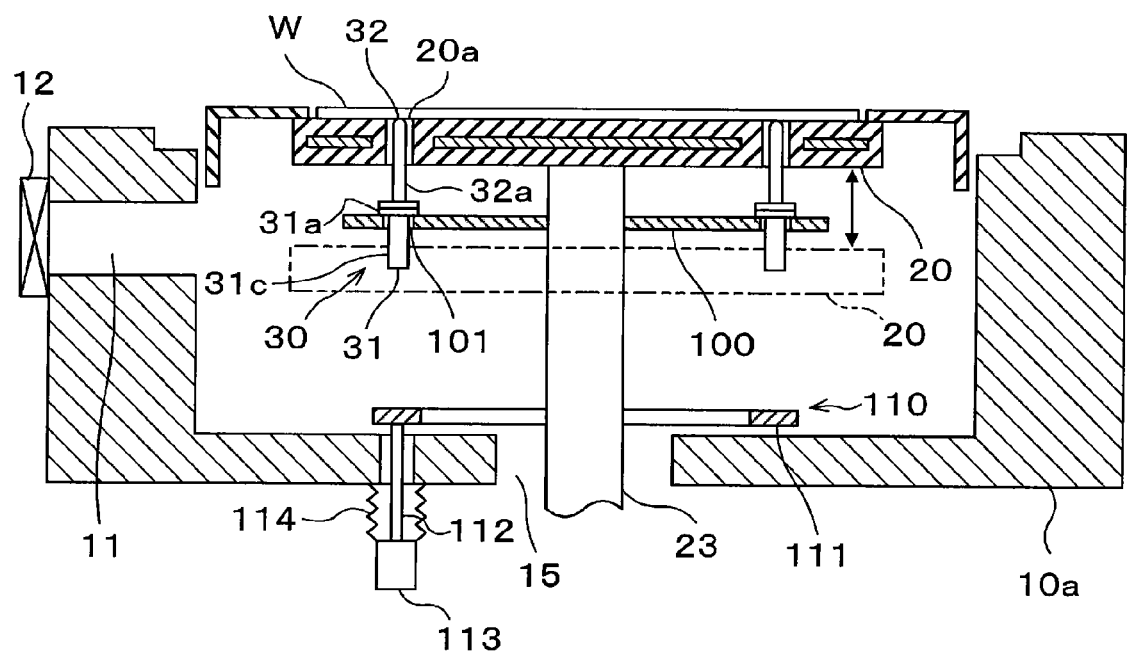
FIG. 3 is a partially enlarged sectional view showing an internal state of the film-forming apparatus shown in FIG. 1 and showing a state when a stage is moved to a processing position.
Figure 4:
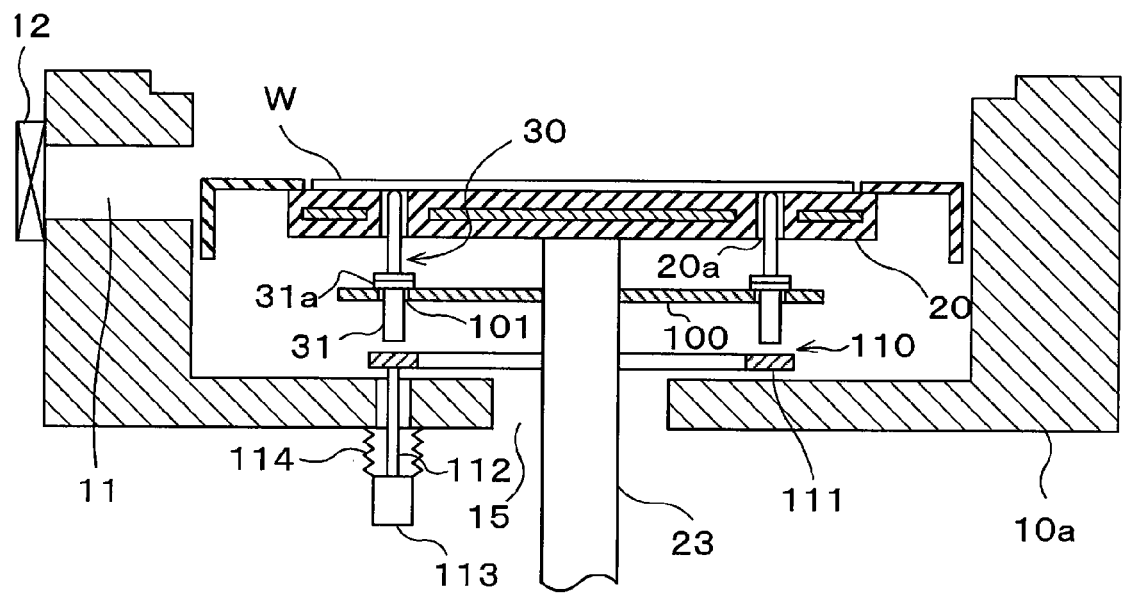
FIG. 4 is a partially enlarged sectional view showing the internal state of the film-forming apparatus shown in FIG. 1 and showing a state when the stage is moved to a transfer position.
Figure 5:
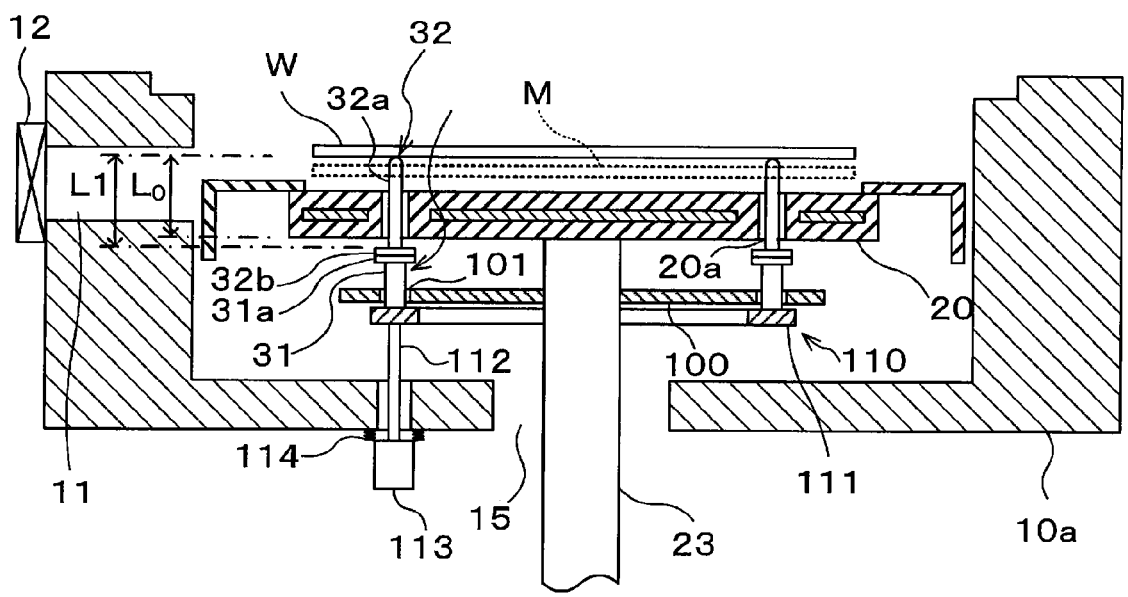
FIG. 5 is a partially enlarged sectional view showing the internal state of the film-forming apparatus shown in FIG. 1 and showing a state when a wafer W is delivered between the lift pins and a wafer transfer device.

Next, the shape of the lift pins 30, the support structure of the lift pins 30, and the structure for moving the lift pins 30 up and down will be described with reference to FIG. 1 and FIGS. 2 to 5. FIG. 2 is an explanatory view showing an outline of the configuration of the lift pins 30. FIGS. 3 to 5 are partially enlarged sectional views showing the internal states of the film-forming apparatus 1 shown in FIG. 1. FIG. 3 shows a state when the stage 20 is moved to the processing position, FIG. 4 shows a state when the stage 20 is moved to the transfer position, and FIG. 5 shows a state when the wafer W is delivered between the lift pins 30 and the wafer transfer device.

As shown in FIGS. 1 to 3, each of the lift pins 30 includes a first member 31 having a flange portion 31a located below the lower surface of the stage 20, and a second member 32 formed separately from the first member 31 and having an insertion portion 32a to be inserted into each of the through-holes 20a of the stage 20. The first member 31 and the second member 32 are made of, for example, alumina.

The flange portion 31a is provided, for example, at the upper end of the first member 31. The flange portion 31a locks the first member 31 to a pin support member 100 described later. Furthermore, the first member 31 has a sliding surface 31b on which the second member 32 is placed and which slidably supports the second member 32. In other words, the first member 31 supports the second member 32 from below by the sliding surface 31b so that the second member 32 can slide along the sliding surface 31b. In this example, the upper end surface of the first member 31 including the upper end surface of the flange portion 31a serves as the sliding surface 31b. Furthermore, in the first member 31, an insertion portion 31c below the flange portion 31a is formed in a rod shape. The insertion portion 31c is inserted into an insertion hole 101 of the below-described pin support member 100 as shown in FIG. 3. The insertion portion 31c is formed thicker than the insertion portion 32a of the second member 32.

As shown in FIG. 2, the second member 32 has a seating portion 32b provided below the insertion portion 32a, specifically, at the lower end of the second member 32. The seating portion 32b has a contact surface 32c that has a larger diameter than the insertion portion 32a and that makes contact with the sliding surface 31b of the first member 31.

In addition, the length of the second member 32 (specifically, the length from the upper end surface of the second member 32 to the contact surface making contact with the sliding surface 31b of the first member 31) is set to be larger than the distance from the lower surface of the stage 20 located at a position spaced apart farthest from the first member 31, i.e., the processing position, to the sliding surface 31b of the first member 31.

Each of the through-holes 20a of the stage 20 through which the lift pins 30 are inserted from below is formed to be thinner than the flange portion 31a of the first member 31 of each of the lift pins 30. In other words, the inner diameter of each of the through-holes 20a of the stage 20 is set to be smaller than the diameter of the flange portion 31a. Specifically, for example, the diameter of the insertion portion 32a of the second member 32 of each of the lift pins 30 is 1.0 mm to 3.0 mm, and the diameter of the flange portion 31a is twice or more as large as the diameter of the insertion portion 32a. In contrast, the inner diameter of each of the through-hole 20a of the stage 20 is set to be 1.2 to 1.5 times as large as the diameter of the insertion portion 32a, for example, 2.0 to 4.0 mm.

Furthermore, with respect to the lift pins 30, there is provided the pin support member 100 which is a member configured to support the lift pins 30, and a pin moving mechanism 110 configured to support the lift pins 30 and move the supported lift pins 30 in the vertical direction. As shown in FIG. 1, the pin support member 100 is provided between the stage 20 and the bottom wall of the processing container 10, and the pin moving mechanism 110 is provided between the pin support member 100 and the bottom wall of the processing container 10. In other words, the pin support member 100 is provided inside the processing container 10 between the stage 20 and the pin moving mechanism 110.

The pin support member 100 supports the lift pins 30 by engaging with the flange portion 31a of the first member 31 of each of the lift pins 30. Specifically, the pin support member 100 movably supports the first member 31 from below so as to be movable in the vertical direction, i.e., in the up/down direction, by engaging with the flange portion 31a. Thus, the pin support member 100 is configured to support the lift pins 30 as a whole from below so that the lift pins 30 can be moved in the up/down direction.

As shown in FIG. 3, the pin support member 100 has insertion holes 101 into which the insertion portions 31c of the first members 31 of the lift pins 30 are inserted and whose inner diameter is larger than the outer diameter of the insertion portion 31c. The pin support member 100 is configured so that, as the upper surface around each of the insertion holes 101 of the pin support member 100 makes contact with the lower surface of the flange portion 31a of the first member 31 inserted into each of the insertion holes 101, the pin support member 100 can support the first member 31 in a suspended state and consequently can support the entire lift pin 30 in a suspended state. Furthermore, with the above-described configuration, the first member 31 slides along the upper surface of the pin support member 100 extending in the horizontal direction in a state in which the insertion portion 31c of the first member 31 is inserted into the respective insertion hole 101, whereby the entire lift pin 30 can slide along the upper surface of the pin support member 100. The first member 31 of each lift pin 30 is horizontally movable along the upper surface of the pin support member 100 within a range defined by the insertion portion 31c and the respective insertion hole 101.

The inner diameter of each insertion hole 101 is set to be, for example, 1.2 to 1.5 times as large as the diameter of the insertion portion 31c of the first member 31.

Moreover, the pin support member 100 is fixed with respect to the stage 20. Specifically, the pin support member 100 is attached to, for example, the support shaft member 23 connected to the stage 20. Therefore, the pin support member 100 is vertically moved together with the stage 20 by the drive mechanism 24, and is also rotated together with the stage 20.

In the state where the stage 20 is moved to the processing position as shown in FIG. 3, the pin support member 100 and the flange portion 31a of the first member 31 of each lift pin 30 are engaged with each other. In this state, the length of the insertion portion 32a of the second member 32 of each lift pin 30 is set so as to satisfy the following conditions (A) and (B):

(A) the upper end surface of the insertion portion 32a of the second member 32 does not project from the upper surface of the stage 20 (For example, the upper end surface of the second member 32 is located with being spaced downward from the upper surface of the stage 20 by 0.1 mm to 0.3 mm); and (B) the upper end surface of the insertion portion 32a is located above the lower surface of the stage 20, and at least a portion of the insertion portion 32a is inserted into the respective through-hole 20a of the stage 20.

The above-described engagement of the pin support member 100 with the flange portion 31a of the first member 31 of each lift pin 30 is not released by merely moving the stage 20 to the transfer position as shown in FIG. 4. When the lift pins 30 are raised by the pin moving mechanism 110 as shown in FIG. 5 in a state in which the stage 20 is moved to the transfer position, the engagement is released. Alternatively, in the process in which the stage 20 is moved to the transfer position and the lift pins 30 are lowered along with the movement of the stage 20, the lower surface of the first member 31 of each lift pin 30 and the upper surface of the pin moving mechanism 110 may come into contact with each other to prevent the lift pins 30 from being further lowered, and the aforementioned engagement may be released when the movement of the stage 20 to the transfer position is completed.

The pin support member 100 is formed of, for example, a plate-shaped member having an annular shape in a plan view and made of a material having a low thermal conductivity such as alumina or quartz. By using a low-heat-conductivity material as the material of the pin support member 100, for example, it is possible to prevent the heat of the stage 20 to which the pin support member 100 is attached, from being taken by the pin support member 100. Furthermore, when an iron-based material or the like is used for the pin support member 100, iron may be mixed into a film formed by the film-forming apparatus 1. However, the use of alumina or quartz for the pin support member 100 can prevent the aforementioned mixture.

The pin moving mechanism 110 is configured to be able to support the first member 31 of each lift pin 30. The pin moving mechanism 110 moves the supported first member 31 in the vertical direction, thereby moving the entire lift pin 30 in the vertical direction. The pin moving mechanism 110 supports the lift pins 30 by engaging with the lower end portions of the first members 31 of the lift pins 30. Specifically, the pin moving mechanism 110 includes a contact member 111 and supports the lift pins 30 as the upper surface of the contact member 111 comes into contact with the lower end surfaces of the first members 31 of the lift pins 30 inserted into the respective insertion holes 101 of the pin support member 100 and exposed from the lower surface of the pin support member 100. The contact member 111 is formed of, for example, a member having an annular shape in a plan view.

A support column 112 is provided on a lower surface of the contact member 111. The support column 112 penetrates the bottom wall of the processing container 10. The support column 112 is connected to a drive mechanism 113 provided outside the processing container 10. The drive mechanism 113 generates a driving force for moving the support column 112 up and down. As the support column 112 is moved up and down with the driving of the drive mechanism 113, the contact member 111 moves up and down, whereby the lift pins 30 supported by the contact member 111 can move up and down independently of the stage 20. In particular, as the support column 112 is moved upward with the driving of the drive mechanism 113, the lift pins 30 move upward. As shown in FIG. 5, the upper end portions of the second members 32 of the lift pins 30 protrude from the upper surface of the stage 20 moved to the transfer position.

In this regard, a distance from the upper end surface of each of the lift pins 30 when the lift pins 30 protrude farthest from the upper surface of the stage 20 to the lower surface of the stage 20, namely a length of a portion of the second member 32 of each lift pin 30 capable of passing through the respective through-hole 20a of the stage 20, is assumed to be $L_0$. A length $L_1$ of the insertion portion 32a of the second member 32 (more specifically, a distance from the upper end surface of each lift pin 30 to an upper surface of the seating portion 32b) is set to be 1.1 times to 1.5 times as large as the length $L_0$.

A bellows 114 is provided between the drive mechanism 113 and the penetration portion of the support column 112 in the bottom wall of the processing container 10 so as to surround the outer periphery of the support column 112. Thus, the processing container 10 is kept airtight.

Next, an example of a method of attaching the lift pins 30 will be described.

For example, the stage 20 including the support shaft member 23 is turned upside down, and the lift pins 30 in which the first member 31 and the second member 32 are fixed to each other by a jig (not shown) is inserted into the respective through-holes 20a of the stage 20. Then, the first members 31 of the lift pins 30 are inserted into the respective insertion holes 101 of the pin support member 100. In that state, the pin support member 100 is attached to the support shaft member 23. Then, the stage 20, which has been turned upside down, is restored and attached to the processing container 10. Thereafter, the jig that fixes the first member 31 and the second member 32 is removed. The lift pins 30 are attached in this manner by way of example.

Next, a wafer process performed using the film-forming apparatus 1 will be described.

First, the gate valve 12 is opened, and the wafer transfer device M (see FIG. 5) holding the wafer W is moved into the processing container 10 from a vacuum-atmosphere transfer chamber (not shown) adjacent to the processing container 10 via the loading/unloading port 11. Then, the wafer W is transferred to above the stage 20 that has been moved to the standby position. Then, the lift pins 30 suspended from the pin support member 100 are raised by the pin moving mechanism 110. Specifically, the first member 31 supporting the second member 32 is raised by the pin moving mechanism 110 with respect to the stage 20 and the wafer transfer device M. As a result, the suspension is released, the lift pins 30 protrude from the upper surface of the stage 20 by a predetermined distance, and the wafer W is delivered onto the lift pins 30, specifically onto the second member 32.

When the lift pins 30 are raised to deliver the wafer W as described above, the positions of the through-holes 20a of the stage 20 may be deviated from the insertion holes 101 of the pin support member 100 due to the thermal expansion or shrinkage of the stage 20.

If the positional deviation of the through-holes 20a is small, by vertically movably supporting the lift pins 30, i.e., by supporting the lift pins 30 in a floating manner, the positions of the lift pins 30 are also deviated in conformity with the positional deviation of the through-holes 20a. Therefore, there is no influence of the positional deviation of the through-holes 20a described above.

However, if each lift pin 30 is an integral body (if each lift pin 30 is not composed of the first member 31 and the second member 32 which are separate bodies, but is an integral body) unlike the present embodiment, the following problems are posed when the positional deviation of the through-holes 20a is large.

Figure 6:
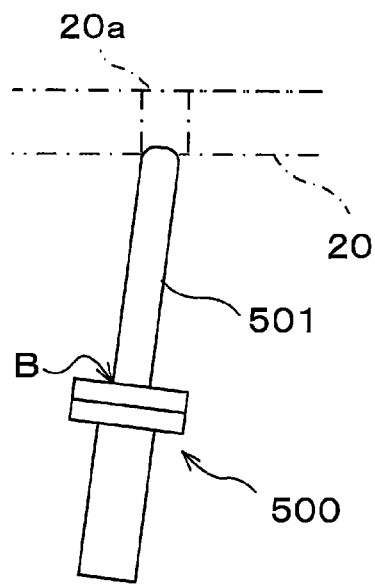
FIG. 6 is a view for explaining a problem when each lift pin is composed of a single integral body.
Figure 7:
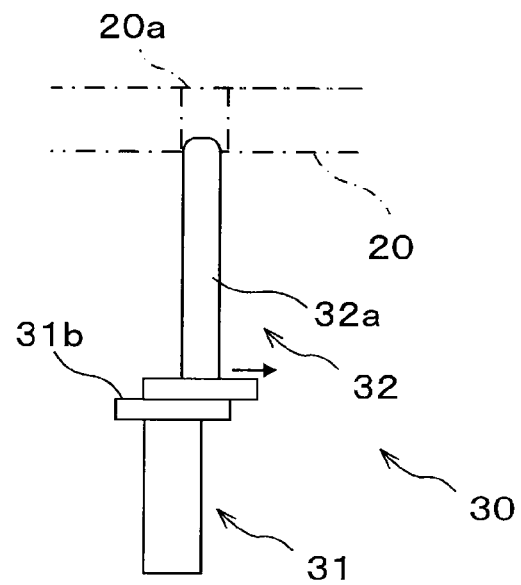
FIG. 7 is a view for explaining an effect when the lift pins is composed of a plurality of members.

That is, when the positional deviation of the through-holes 20a is large, if each lift pin 500 is an integral body as shown in FIG. 6, each lift pin 500 may be tilted. Therefore, when the lift pins 500 are raised, the lift pins 500 may come into contact with the lower surface of the stage 20 or the like. Furthermore, if the lift pins 500 continue to be raised even after the contact with the lower surface of the stage 20 or the like, a large stress may be generated at a root B of the insertion portion 501 of each of the lift pins 500 to be inserted into each of the through-holes 20a of the stage 20, and each of the lift pins 500 may be broken. On the other hand, in the present embodiment, each of the lift pins 30 includes the first member 31 and the second member 32 which are separate bodies, and the second member 32 of each of the lift pins 30 can slide along the sliding surface 31b of the first member 31. Therefore, even when the positional deviation of the through-holes 20a is large, the second member 32 is not tilted at all or tilted a little bit as shown in FIG. 7. Therefore, when the positional deviation of the through-holes 20a is large, even if the lift pins 30 are raised, a large stress is not generated in each of the lift pins 30 such as the insertion portion 32a of the second member 32 or the like. Accordingly, it is possible to prevent breakage of the lift pins 30.

After the wafer W is delivered onto the lift pins 30, the wafer transfer device M is moved out of the processing container 10, and the gate valve 12 is closed. At the same time, the lift pins 30 are lowered by the pin moving mechanism 110, and the stage 20 is raised by the drive mechanism 24. When the lift pins 30 are lowered by the pin moving mechanism 110, specifically, the first member 31 supporting the second member 32 to which the wafer W is delivered is lowered by the pin moving mechanism 110 with respect to the stage 20.

By lowering the lift pins 30 and raising the stage 20, the support of the lift pins 30 by the pin moving mechanism 110 is released, and the lift pins 30 are suspended again by the pin support member 100. At the same time, the upper end portions of the lift pins 30 are accommodated in the respective through-holes 20a of the stage 20 and do not protrude from the upper surface of the stage 20. The wafer W is delivered from the second members 32 of the lift pins 30 onto the stage 20. Then, the inside of the processing container 10 is adjusted to have a predetermined pressure, the stage 20 is moved to the processing position by the drive mechanism 24, and the processing space S is formed.

In this state, an $N_2$ gas as a purge gas is supplied into the processing space S via the gas introduction mechanism 50, and a $TiCl_4$ gas and an $NH_3$ gas are supplied into the processing space S in an alternate and intermittent manner, whereby a TiN film is on the wafer W by an ALD method. During this film formation, the wafer W is heated by the stage 20. For example, the temperature of the wafer W (specifically, the temperature of the stage 20) is set to 300 degrees C. to 600 degrees C.

After the TiN film is formed by the ALD method as described above, the stage 20 on which the wafer W is placed is lowered to the transfer position. Subsequently, the lift pins 30 are raised by the pin moving mechanism 110. Specifically, the first member 31 supporting the second member 32 is raised by the pin moving mechanism 110 with respect to the stage 20 and the wafer transfer device M. As a result, the suspension is released, the lift pins 30 protrude from the upper surface of the stage 20 by a predetermined distance, and the wafer W is delivered onto the lift pins 30, specifically onto the second members 32. Thereafter, the gate valve 12 is opened, and the wafer transfer device M on which no wafer W is held is moved into the processing container 10 via the loading/unloading port 11. The wafer transfer device M is moved between the wafer W held on the lift pins 30 and the stage 20 located at the transfer position. Then, the lift pins 30 are lowered by the pin moving mechanism 110. Specifically, the first member 31 supporting the second member 32 to which the wafer W is delivered is lowered by the pin moving mechanism 110 with respect to the wafer transfer device M. Thus, the wafer W on the second members 32 of the lift pins 30 is delivered to the wafer transfer device M. Then, the wafer transfer device M is moved out of the processing container 10, and the gate valve 12 is closed. In this manner, the wafer process having a series of steps is completed. Thereafter, the above-described wafer process having a series of steps is performed on other wafers W.

As described above, according to the present embodiment, in the film-forming apparatus 1 that heats the wafer W placed on the stage 20 through the use of the stage 20, the flange portion 31a is provided in the portion of each of the lift pins 30 below the lower surface of the stage 20, and the pin support member 100 supports the lift pins 30 by engaging with the flange portion 31a of each of the lift pins 30. That is, the lift pins 30 are not fixed to the pin support member 100 or the like. Therefore, it is unlikely that the lift pins 30 are damaged or the smooth lifting operation of the lift pins 30 is impaired under the influence of the thermal expansion of the stage 20. Furthermore, in the present embodiment, the through-holes 20a (especially, the upper end portions thereof) of the stage 20 through which the lift pins 30 are inserted are formed to be thinner than the flange portions 31a of the lift pins 30. Thus, the diameter of the lift pins 30 can be made smaller than the conventional lift pins. Therefore, according to the present embodiment, for example, as compared with the configuration of Patent Document 1, it is possible to suppress a decrease in the temperature of the portions of the wafer W corresponding to the through-holes 20a, which makes it possible to improve the in-plane uniformity of the temperature of the wafer W. Furthermore, in the present embodiment, each of the lift pins 30 includes the first member 31 having the flange portion 31a and the second member 32 as a separate body from the first member 31 and having the insertion portion 32a. The first member 31 has the sliding surface 31b on which the second member 32 is placed and which slidably supports the second member 32. Therefore, it is possible to further reduce the possibility that the lift pins 30 are damaged or the smooth lifting operation of the lift pins 30 is impaired under the influence of the thermal expansion of the stage 20. In particular, it is possible to prevent breakage of the lift pins 30.

As the technique for improving the in-plane uniformity of the temperature of the wafer W, one available technique makes use of edge pins for supporting the edge of the wafer W. However, here, the stage is required to have through-holes through which the edge pins are inserted, and the edge of the wafer W is located on the insertion holes. Therefore, a film may be also formed on the back surface of the wafer W. In the present embodiment, such film formation on the back surface of the wafer W does not occur.

Furthermore, in the present embodiment, an operating member such as a clamp or the like that may be a source of releasing a foreign substance is not used in order to support the lift pins 30. Therefore, according to the present embodiment, it is possible to prevent the quality of the TiN film formed on the wafer W from being deteriorated.

In the present embodiment, the insertion portion 31c of the first member 31 of each of the lift pins 30 is formed thicker than the insertion portion 32a of the second member 32. Therefore, when the lift pins 30 are supported from below by the pin moving mechanism 110, it is possible to stably support the lift pins 30.

In addition, in the present embodiment, the length $L_1$ of the insertion portion 32a of the second member 32 of each of the lift pins 30 is set to be 1.1 to 1.5 times as large as the length $L_0$ of the portion of the second member 32 of each of the lift pins 30 that can pass through the respective through-hole 20a of the stage 20. That is, in the present embodiment, the length $L_1$ of the insertion portion 32a of each of the lift pins 30 is set as short as possible. For that reason, even if the lift pins 30 come into contact with the stage 20 when the lift pins 30 are moved up and down, the stress generated in the second member 32 is small. Therefore, the second member 32 is less likely to be damaged by the stress. This makes it possible to reduce the diameter of the second member 32 and to reduce the inner diameter of the through-holes 20a of the stage 20. Accordingly, it is possible to further improve the in-plane uniformity of the temperature of the wafer W.

Further, in the present embodiment, the lift pins 30 are supported by the pin support member 100 provided between the stage 20 and the pin moving mechanism 110 in the vertical direction. Therefore, the length of the second member 32 of each of the lift pins 30 can be shortened compared to a configuration in which the pin support member 100 is omitted and the pin moving mechanism 110 is configured to support the lift pins 30. Thus, as mentioned above, the second member 32 is less likely to be damaged by the stress. This makes it possible to reduce the diameter of the second member 32 and to reduce the inner diameter of the through-holes 20a of the stage 20. Accordingly, it is possible to further improve the in-plane uniformity of the temperature of the wafer W.

Furthermore, in the present embodiment, the length of the second member 32 is longer than the distance from the lower surface of the stage 20 at the processing position farthest from the first member 31 to the sliding surface 31b of the first member 31. In other words, the length of the second member 32 is such that when the second member 32 is supported by the first member 31, the upper end of the insertion portion 32a is always located in the respective through-hole 20a of the stage 20 during the film-forming process. For that reason, the upper end of the second member 32 does not come out of the respective through-hole 20a of the stage 20 during the film-forming process. Therefore, it is possible to prevent the second member 32 from falling into the processing container 10. In addition, it is not necessary to align the second member 32 with the respective through-hole 20a of the stage 20.

Figure 8:
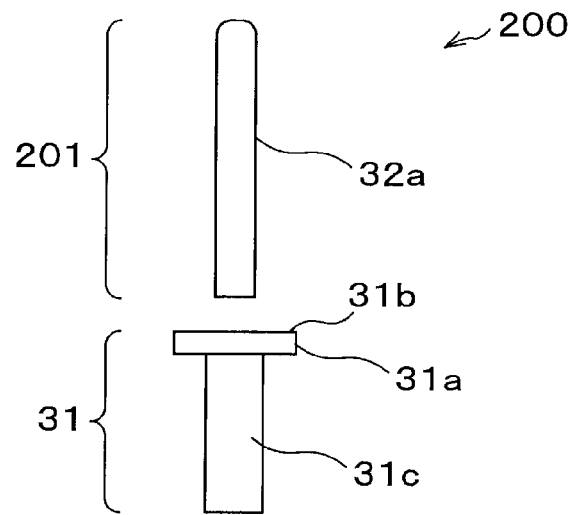
FIG. 8 is a view for explaining another example of a second member of each lift pin.

FIG. 8 is a view illustrating another example of the second member of each lift pin.

Although the second member 32 in the above example is provided with the seating portion 32b, the second member 32 may be formed in a rod shape as a whole without any seating portion as in the second member 201 of each lift pin 200 shown in FIG. 8. However, by providing the seating portion 32b on the second member 32 as shown in FIG. 2, the second member 32 can be more easily supported in a non-inclined state.

Figure 9:
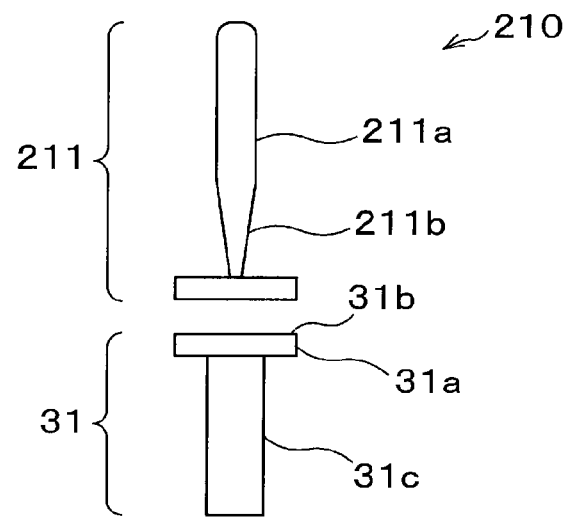
FIG. 9 is a view for explaining another example of a second member of each lift pin.
Figure 10:
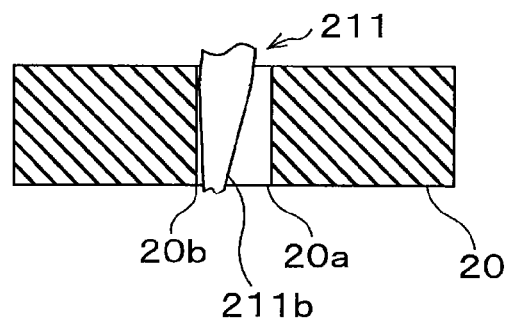
FIG. 10 is a partially enlarged sectional view of the lift pin of FIG. 9 inserted into a through-hole of the stage.

FIG. 9 is a view illustrating a further example of the second member of each lift pin. FIG. 10 is a partially enlarged sectional view of the lift pin shown in FIG. 9, which is inserted into the through-hole 20a of the stage 20.

A second member 211 of a lift pin 210 shown in FIG. 9 has a small-diameter portion 211b formed in an insertion portion 211a to be inserted into the respective through-hole 20a of the stage 20. By providing the small-diameter portion 211b in this manner, even if the second member 211 is tilted as shown in FIG. 10, when the second member 211 is moved up, the second member 211 does not make contact with an edge 20b of the through-hole 20a of the stage 20. Therefore, it is possible to more reliably prevent the breakage of the second member 211, namely the breakage of the lift pin 210.

The small-diameter portion 211b is provided, for example, in the second member 211 at a position corresponding to a lower portion of the through-hole 20a of the stage 20 when the second member 211 is most raised. In the example of FIG. 9, the small-diameter portion 211b is provided at the root, i.e., a lower end of the insertion portion 211a.

Furthermore, the small-diameter portion 211b has, for example, a tapered shape whose diameter decreases going downward. With this shape, as compared with the cylindrical shape, it is possible to prevent the second member 211 from colliding with the edge 20b of the through-hole 20a of the stage 20 while maintaining the strength of the second member 211.

Figure 11:
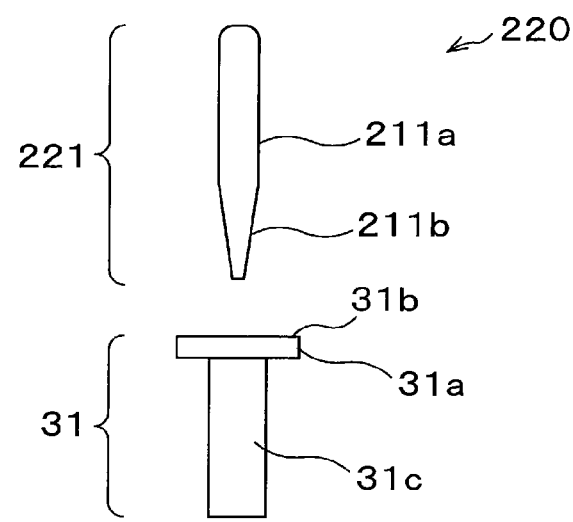
FIG. 11 is a view for explaining another example of a second member of each lift pin.

FIG. 11 is a view illustrating another example of the second member of each lift pin.

Even when a second member 221 is not provided with the flange portion like a lift pin 220 shown in FIG. 11, the second member 221 may be provided with a small-diameter portion 211b.

Figure 12:
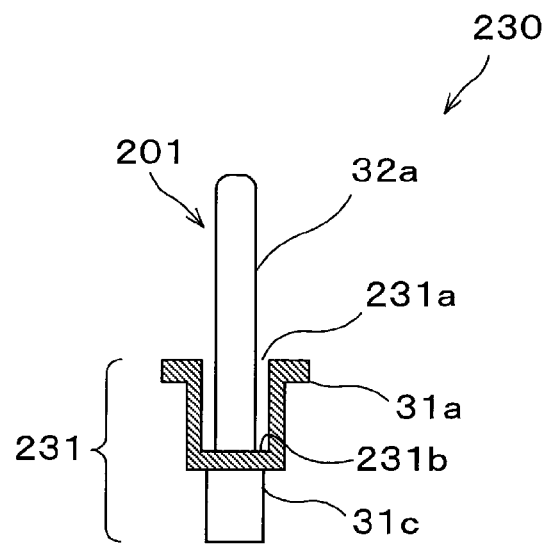
FIG. 12 is a partial sectional view for explaining another example of a first member of each of the lift pins.

FIG. 12 is a partial sectional view illustrating another example of the first member of each lift pin.

A first member 231 of a lift pin 230 shown in FIG. 12 has a recess 231a provided on the upper side thereof so that the lower portion of the second member 201 is inserted into the recess 231a. By providing the recess 231a in this way, even if the upper end of the second member 201 comes out of the through-hole 20a of the stage 20, the second member 201 can be prevented from falling into the processing container 10.

In this example, a bottom surface 231b of the recess 231a serves as a sliding surface that slidably supports the second member 201.

Figure 13:
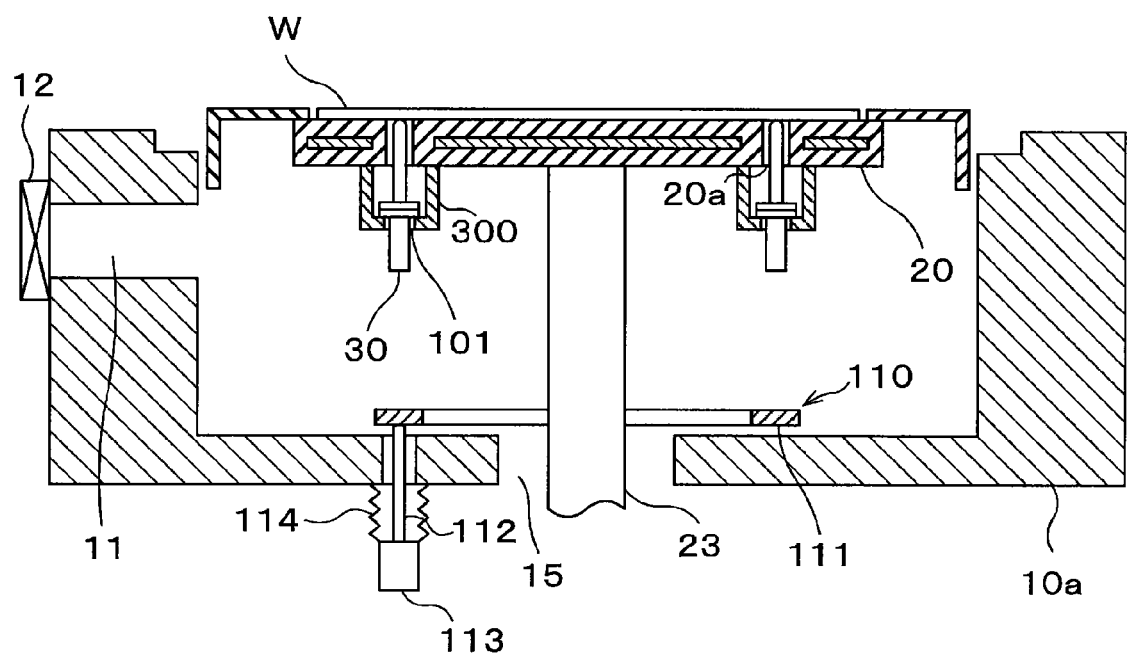
FIG. 13 is a view for explaining another example of a pin support member that supports the lift pins in a suspended state.
Figure 14:
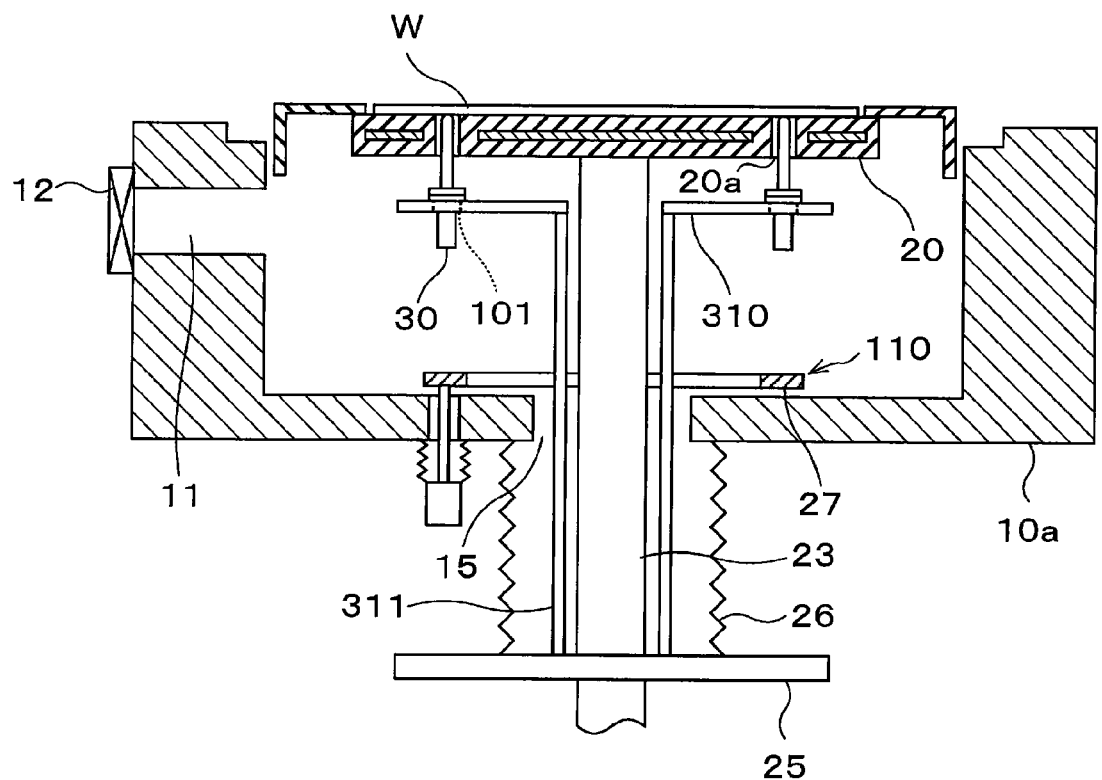
FIG. 14 is a view for explaining another example of a pin support member that supports the lift pins in a suspended state.
Figure 15:
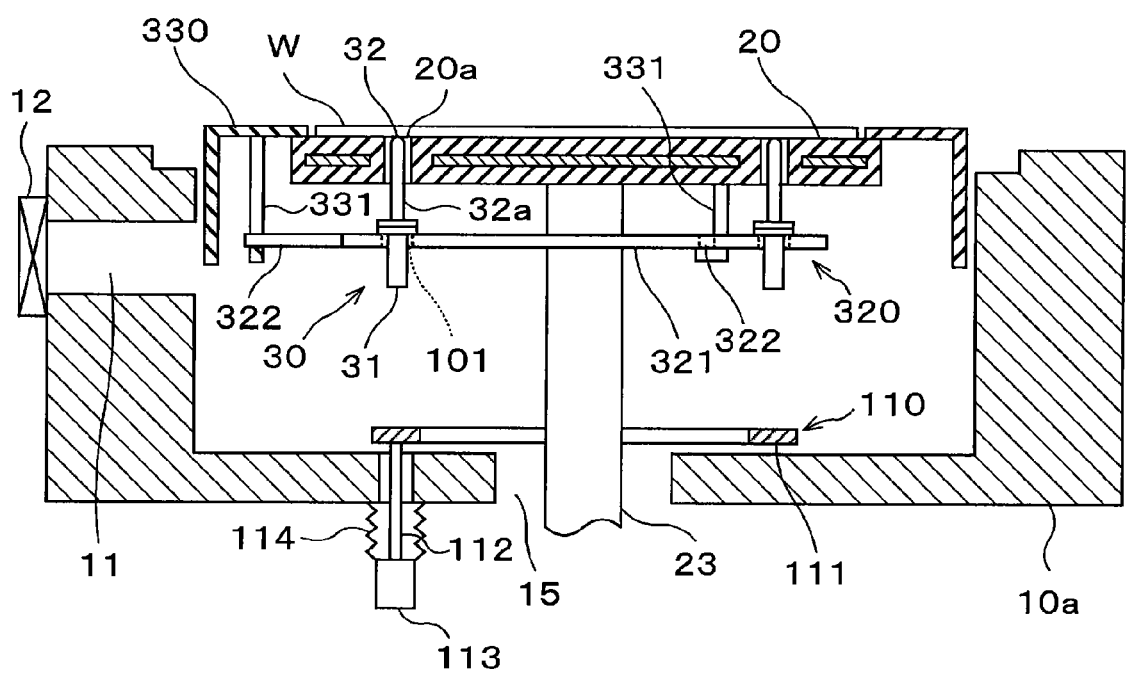
FIG. 15 is a view for explaining another example of a pin support member that supports the lift pins in a suspended state.

FIGS. 13 to 15 are views illustrating other examples of the pin support member that suspends the lift pins 30.

The pin support member 100 in the example of FIG. 1 is attached to the support shaft member 23. However, the attachment position of the member that suspends the lift pins 30 is not limited to this example.

A pin support member 300 in the example of FIG. 13 is attached to the stage 20. Since the pin support member 300 can be downsized, it is possible to reduce the heat capacity of the pin support member 300. Therefore, the amount of heat to be taken by the pin support member 300 can be reduced, which makes it possible to efficiently heat the wafer W.

A pin support member 310 in the example of FIG. 14 is attached to the flange 25 as a fixed member. Specifically, the pin support member 310 is attached to the flange 25 via a leg portion 311 extending in the vertical direction. Since the pin support member 310 is not attached to the support shaft member 23 and the stage 20, the heat of the stage 20 is not taken away by the pin support member 310 in a direct manner or via the support shaft member 23. This makes it possible to more efficiently heat the wafer W.

A pin support member 320 in the example of FIG. 15 is attached to a cover member 330. In this example, the pin support member 320 includes a main body 321 having an annular shape in a plan view and having insertion holes 101 into which the first members 31 of the lift pins 30 are inserted, and a plurality of tongue pieces 322 extending outward from the main body 321. Furthermore, the cover member 330 has a plurality of L-shaped claw portions 331 formed so as to extend downward from the upper end thereof. The pin support member 320 is attached to the cover member 330 by the engagement between the tongue pieces 322 of the pin support member 320 and the claw portions 331 of the cover member 330.

The pin support members 310 and 320 in the examples of FIGS. 14 and 15 can be attached without changing the design of the stage 20 including the support shaft member 23.

Figure 16:
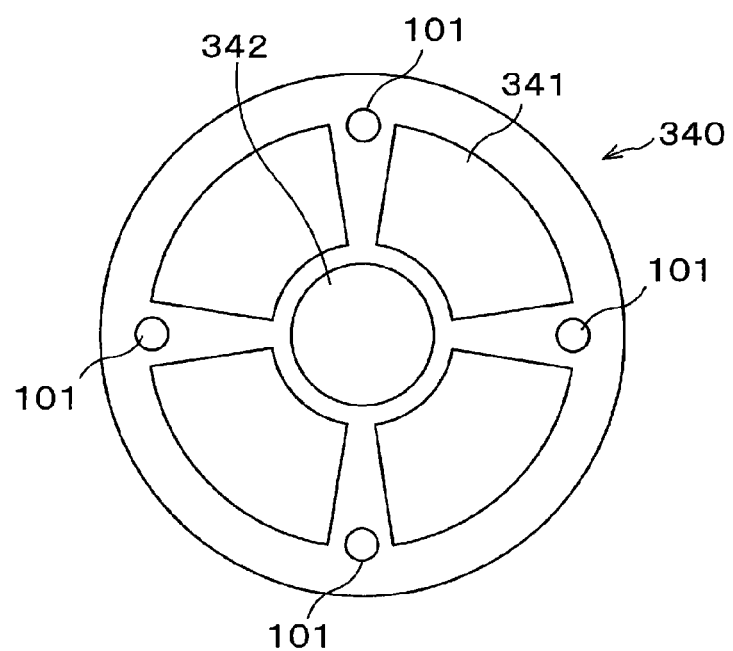
FIG. 16 is a plan view showing a modification of the pin support member shown in FIG. 1.

FIG. 16 is a plan view showing a modification of the pin support member 100 of the example shown in FIG. 1. The pin support member 100 in the example of FIG. 1 is attached to the support shaft member 23 to support the lift pins 30, and only an insertion hole for the support shaft member 23 and insertion holes 101 for the lift pins 30 are mainly provided in the plate-like member having a circular shape in a plan view. However, the shape of the member attached to the support shaft member 23 and configured to support the lift pins 30 is not limited to this example.

A pin support member 340 in the example of FIG. 16 has a shape provided with recessed portions 341. The recessed portions 341 are formed in a region other than the regions that engage with the lift pins 30. Specifically, when seen in a plan view, the recessed portions 341 are formed in a region other than a region in which the insertion holes 101 for the insertion of the lift pins 30 are formed and a region in which an insertion hole 342 for the support shaft member 23 is formed. The recessed portions 341 may be through-holes or grooves.

Since the pin support member 340 has the recessed portions 341, it is possible to reduce the heat capacity of the pin support member 340. Therefore, the amount of heat taken by the pin support member 340 can be reduced, and the wafer W can be efficiently heated.

The recessed portions may be provided on the stage 20, the flange 25, and the pin support member attached to the cover member 330, as in the examples of FIGS. 13 to 15.

In the above example, the pin moving mechanism 110 that moves the lift pins 30 in the vertical direction is provided.

However, the pin moving mechanism 110 may be omitted if the following conditions (C) and (D) are satisfied:

(C) the wafer transfer device M is configured to be vertically movable; and (D) the upper end portions of the lift pins 30 protrude from the upper surface of the stage 20 in a state in which the stage 20 is moved to the transfer position.

In this case, as the stage 20 is being moved to the transfer position, the lower surfaces of the lift pins 30 come into contact with, for example, the bottom wall of the processing container 10 to prevent the lift pins 30 from moving further downward. Thus, the upper end portions of the lift pins 30 protrude from the upper surface of the stage 20 in the state in which the stage 20 is moved to the transfer position. placement surface Furthermore, in the above-described embodiments, both the placement surface of the first member of each lift pin and the contact surface of the second member facing the placement surface are flat surfaces. Either one or both of the placement surface and the contact surface may have a curved shape.

Although the film formation is performed by the ALD method in the above-described embodiments, the technique according to the present disclosure may be applied to a case where the film formation is performed by a CVD method. For example, the technique according to the present disclosure may be applied to a case of forming a Si film or a SiN film by a CVD method using a Si-containing gas.

Although the film-forming apparatus has been described above as an example, the technique according to the present disclosure may also be applied to a substrate processing apparatus that includes a stage and performs a process other than the film-forming process. For example, the technique according to the present disclosure may also be applied to an inspection apparatus that performs an inspection process or an etching apparatus.

It should be noted that the embodiments and modifications disclosed herein are exemplary in all respects and are not restrictive. The above-described embodiments may be omitted, replaced or modified in various forms without departing from the scope and spirit of the appended claims.

The following configurations also belong to the technical scope of the present disclosure:

(1). A substrate processing apparatus for processing a substrate, including: a stage having a through-hole penetrating the stage in a vertical direction and configured to place the substrate on an upper surface thereof and perform at least one of a heating process and a cooling process on the placed substrate; a substrate support pin provided with an insertion portion inserted into the through-hole and configured so that the insertion portion protrudes from the upper surface of the stage through the through-hole; and a pin support member configured to support the substrate support pin, wherein the substrate support pin is provided with a flange portion located below a lower surface of the stage, the pin support member is configured to support the substrate support pin by engagement with the flange portion, the through-hole of the stage is smaller than the flange portion of the substrate support pin, the substrate support pin includes a first member including the flange portion and a second member separated from the first member and provided with the insertion portion, and the first member has a sliding surface on which the second member is placed and which slidably supports the second member.

According to (1) above, it is possible to improve the in-plane uniformity of the temperature of the substrate. In addition, it is possible to prevent the substrate support pin from being damaged and to prevent smooth lifting movement of the substrate support pin from being impaired. In particular, it is possible to prevent breakage of the substrate support pin.

(2). In the apparatus according to (1) above, the second member includes a seating portion having a diameter larger than that of the insertion portion and having a contact surface that makes contact with the sliding surface.

According to (2) above, the second member can be more easily supported in a non-tilted state.

(3). In the apparatus according to (1) or (2) above, the second member includes a small-diameter portion formed in the insertion portion.

According to (3) above, it is possible to more reliably prevent the breakage of the second member.

(4). In the apparatus according to any one of (1) to (3) above, the first member has a recess into which a lower portion of the second member is inserted.

According to (4) above, even if the upper end of the second member comes out of the respective through-hole of the stage, the second member can be prevented from falling into the processing container.

(5). In the apparatus according to any one of (1) to (4) above, the length of the second member is longer than the distance from a lower surface of the stage located at a position farthest from the first member to the sliding surface of the first member.

According to (5) above, the upper end of the second member does not come out of the through-hole of the stage during the substrate process.

(6). The apparatus according to any one of (1) to (5) above further includes a pin moving mechanism configured to move the substrate support pin in the vertical direction. The pin support member is provided between the stage and the pin moving mechanism.

According to (6) above, the length of the second member can be shortened as compared with a configuration in which the pin support member is omitted and the pin moving mechanism is configured to support the substrate support pin. Therefore, it is possible to reduce the stress generated in the substrate support pin when the substrate support pin comes into contact with the inner wall of the through-hole or the like at the time of raising or lowering the substrate support pin. This makes it possible to reduce the diameter of the substrate support pin and to reduce the inner diameter of the through-hole. Accordingly, it is possible to further improve the in-plane uniformity of the temperature of the substrate.

(7). In the apparatus according to any one of (1) to (6) above, the pin support member has an insertion hole into which a portion of the first member below the flange portion is inserted.

According to (7) above, the first member can be suspended by the pin support member.

(8). The apparatus according to any one of (1) to (7) above further includes a moving mechanism configured to move the stage in the vertical direction.

(9). In the apparatus according to any one of (1) to (8) above, the diameter of the insertion portion of the second member is 1.0 to 3.0 mm, and the inner diameter of the through-hole is 2.0 to 4.0 mm.

(10). The apparatus according to any one of (1) to (9) above further includes a stage support member having an upper end portion connected to a lower surface of the stage to support the stage. The pin support member is attached to the stage support member.

(11). In the apparatus according to any one of (1) to (9) above, the pin support member is attached to a lower surface of the stage.

(12). The apparatus according to any one of (1) to (9) above further includes a stage support member having an upper end portion connected to a lower surface of the stage to support the stage, and a fixed member to which the stage support member is fixed. The pin support member is attached to the fixed member.

(13). In the apparatus according to any one of (1) to (9) above includes a cover member configured to cover a lateral surface of the stage. The pin support member is supported by the cover member.

(14). In the apparatus according to any one of (1) to (13) above, the pin support member includes a recessed portion formed in a region other than a region of the substrate support pin that engages with the flange portion.

According to (14) above, the heat capacity of the pin support member can be reduced. Therefore, the substrate can be efficiently heated or cooled down.

(15). There is provided a method of delivering a substrate to and from a substrate transfer device of a substrate processing apparatus. The substrate processing apparatus includes: a stage having a through-hole penetrating the stage in a vertical direction and configured to place the substrate on an upper surface thereof and perform at least one of a heating process and a cooling process on the placed substrate; a substrate support pin provided with an insertion portion inserted into the through-hole and configured so that the insertion portion protrudes from the upper surface of the stage through the through-hole; and a pin support member configured to support the substrate support pin, wherein the substrate support pin is provided with a flange portion located below a lower surface of the stage, the pin support member is configured to support the substrate support pin by engagement with the flange portion, the through-hole of the stage is smaller than the flange portion of the substrate support pin, the substrate support pin includes a first member including the flange portion and a second member separated from the first member and provided with the insertion portion, and the first member has a sliding surface on which the second member is placed and which slidably supports the second member. The method includes: delivering the substrate on the stage or the substrate transfer device to the second member by raising the first member that supports the second member with respect to the stage or the substrate transfer device; and delivering the substrate from the second member onto the substrate transfer device by lowering the first member that supports the second member, to which the substrate is delivered from the stage, with respect to the substrate transfer device, or delivering the substrate from the second member onto the stage by lowering the first member that supports the second member, to which the substrate is delivered from the substrate transfer device, with respect to the stage.

According to the present disclosure in some embodiments, it is possible to improve the in-plane uniformity of a temperature of a substrate when heating or cooling the substrate placed on a stage having through-holes through which substrate support pins are inserted, and to prevent breakage of the substrate support pins.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus for processing a substrate, comprising:
a stage having a through-hole penetrating the stage in a vertical direction and configured to place the substrate on an upper surface thereof and perform at least one of a heating process and a cooling process on the placed substrate;
a lift pin provided with an insertion portion inserted into the through-hole and configured so that the insertion portion protrudes from the upper surface of the stage through the through-hole; and
a pin support configured to support the lift pin,
wherein the lift pin is provided with a flange portion located below a lower surface of the stage,
wherein the pin support is configured to support the lift pin by engagement with the flange portion,
wherein the through-hole of the stage is smaller than the flange portion of the lift pin,
wherein the lift pin comprises a first member including the flange portion provided at an upper end of the first member and a second member separated from the first member and provided with the insertion portion, and
wherein an upper end surface of the flange portion is a sliding surface on which the second member is placed and slidably supports the second member.

2. The apparatus of claim 1, wherein the second member comprises a seating portion having a diameter larger than that of the insertion portion and having a contact surface that makes contact with the sliding surface.

3. The apparatus of claim 2, wherein the second member comprises a small-diameter portion formed in the insertion portion.

4. The apparatus of claim 3, wherein the first member has a recess into which a lower portion of the second member is inserted.

5. The apparatus of claim 4, wherein the length of the second member is longer than a distance from the lower surface of the stage located at a position farthest from the first member to the sliding surface of the first member.

6. The apparatus of claim 5, further comprising:
a pin mover configured to move the lift pin in the vertical direction,
wherein the pin support is provided between the stage and the pin mover.

7. The apparatus of claim 6, wherein the pin support has an insertion hole into which a portion of the first member below the flange portion is inserted.

8. The apparatus of claim 1, wherein the second member comprises a small-diameter portion formed in the insertion portion.

9. The apparatus of claim 1, wherein the first member has a recess into which a lower portion of the second member is inserted.

10. The apparatus of claim 1, wherein the length of the second member is longer than a distance from the lower surface of the stage located at a position farthest from the first member to the sliding surface of the first member.

11. The apparatus of claim 1, further comprising:
a pin mover configured to move the lift pin in the vertical direction, wherein the pin support is provided between the stage and the pin mover.

12. The apparatus of claim 1, wherein the pin support has an insertion hole into which a portion of the first member below the flange portion is inserted.

13. The apparatus of claim 1, further comprising:
a mover configured to move the stage in the vertical direction.

14. The apparatus of claim 1, wherein a diameter of the insertion portion of the second member is 1.0 to 3.0 mm, and an inner diameter of the through-hole is 2.0 to 4.0 mm.

15. The apparatus of claim 1, further comprising:
a stage support member having an upper end portion connected to the lower surface of the stage to support the stage,
wherein the pin support is attached to the stage support member.

16. The apparatus of claim 1, wherein the pin support is attached to the lower surface of the stage.

17. The apparatus of claim 1, further comprising:
a stage support member having an upper end portion connected to the lower surface of the stage to support the stage; and
a fixed member to which the stage support member is fixed,
wherein the pin support is attached to the fixed member.

18. The apparatus of claim 1, further comprising:
a cover member configured to cover a lateral surface of the stage,
wherein the pin support is supported by the cover member.

19. The apparatus of claim 1, wherein the pin support comprises a recessed portion formed in a region other than a region of the lift pin that engages with the flange portion.

20. A method of delivering a substrate to and from a substrate transfer device of a substrate processing apparatus, wherein the substrate processing apparatus comprises:

a stage having a through-hole penetrating the stage in a vertical direction and configured to place the substrate on an upper surface thereof and perform at least one of a heating process and a cooling process on the placed substrate;
a lift pin provided with an insertion portion inserted into the through-hole and configured so that the insertion portion protrudes from the upper surface of the stage through the through-hole; and
a pin support configured to support the lift pin,
wherein the lift pin is provided with a flange portion located below a lower surface of the stage,
wherein the pin support is configured to support the lift pin by engagement with the flange portion,
wherein the through-hole of the stage is smaller than the flange portion of the lift pin,
wherein the lift pin includes a first member comprising the flange portion provided at an upper end of the first member and a second member separated from the first member and provided with the insertion portion, and
wherein an upper end surface of the flange portion is a sliding surface on which the second member is placed and which slidably supports the second member, and the method comprising:
delivering the substrate on the stage or the substrate transfer device to the second member by raising the first member that supports the second member with respect to the stage or the substrate transfer device; and
delivering the substrate from the second member onto the substrate transfer device by lowering the first member that supports the second member, to which the substrate is delivered from the stage, with respect to the substrate transfer device, or delivering the substrate from the second member onto the stage by lowering the first member that supports the second member, to which the substrate is delivered from the substrate transfer device, with respect to the stage.

* * * * *